United States Patent [19]
Shimoda

[11] Patent Number: 5,373,257
[45] Date of Patent: Dec. 13, 1994

[54] PHASE SYNCHRONIZATION CIRCUIT HAVING A LOOP FILTER INCLUDING TWO VOLTAGE/CURRENT CONVERTERS

[75] Inventor: Kaneyasu Shimoda, Kawasaki, Japan
[73] Assignee: Fujitsu Limited, Kawasaki, Japan
[21] Appl. No.: 141,732
[22] Filed: Oct. 27, 1993
[30] Foreign Application Priority Data
Oct. 28, 1992 [JP] Japan ................ 4-289773
[51] Int. Cl.[5] ............ H03L 7/089; H03L 7/093
[52] U.S. Cl. .................. 331/8; 331/17; 331/25
[58] Field of Search .................. 331/8, 17, 25

[56] References Cited
U.S. PATENT DOCUMENTS

| | | | |
|---|---|---|---|
| 4,890,299 | 12/1989 | Dolivo et al. | 375/18 |
| 4,894,734 | 1/1990 | Fischler et al. | 360/51 |
| 5,136,260 | 8/1992 | Yousefi-Elezei | 331/17 |

OTHER PUBLICATIONS

F. M. Gardner, "Hangup in phase-lock loops", IEEE Transactions On Communications, Publication Date Oct. 1977; vol. Com-25, No. 10, pp. 1210-1214.
K. H. Mueller et al, "Timing Recovery in Digital Synchronous Data Receivers", IEEE Transactions On Communications, Publication Date May 1976; vol. Com-24, No. 5, pp. 516-531.

Primary Examiner—Siegfried H. Grimm
Attorney, Agent, or Firm—Armstrong, Westerman, Hattori, McLeland & Naughton

[57] ABSTRACT

In a phase synchronization circuit for generating a clock signal from an input signal, having a VCO, a phase comparator for comparing the phase of the input signal with that of an output signal of the VCO, and a loop filter for receiving an output signal of the phase comparator and providing a control voltage for the VCO, the loop filter includes first and second voltage-current converters for receiving the output signal of the phase comparator; a capacitor to be charged and discharged according to an output current of the first voltage-current converter; and a resistor for converting the output signal of the second voltage-current converter into the control voltage for the VCO. The ratio between currents for the input and output stages of a current multiplier in each of the first and second voltage-current converters is changed according to a control current provided through a control terminal when the frequency of the input signal is changed, to thereby change a transconductance of the converters without changing a damping factor. In this way, the circuit speedily carries out phase synchronization without changing a damping factor even if the frequency of an input signal is changed.

21 Claims, 17 Drawing Sheets

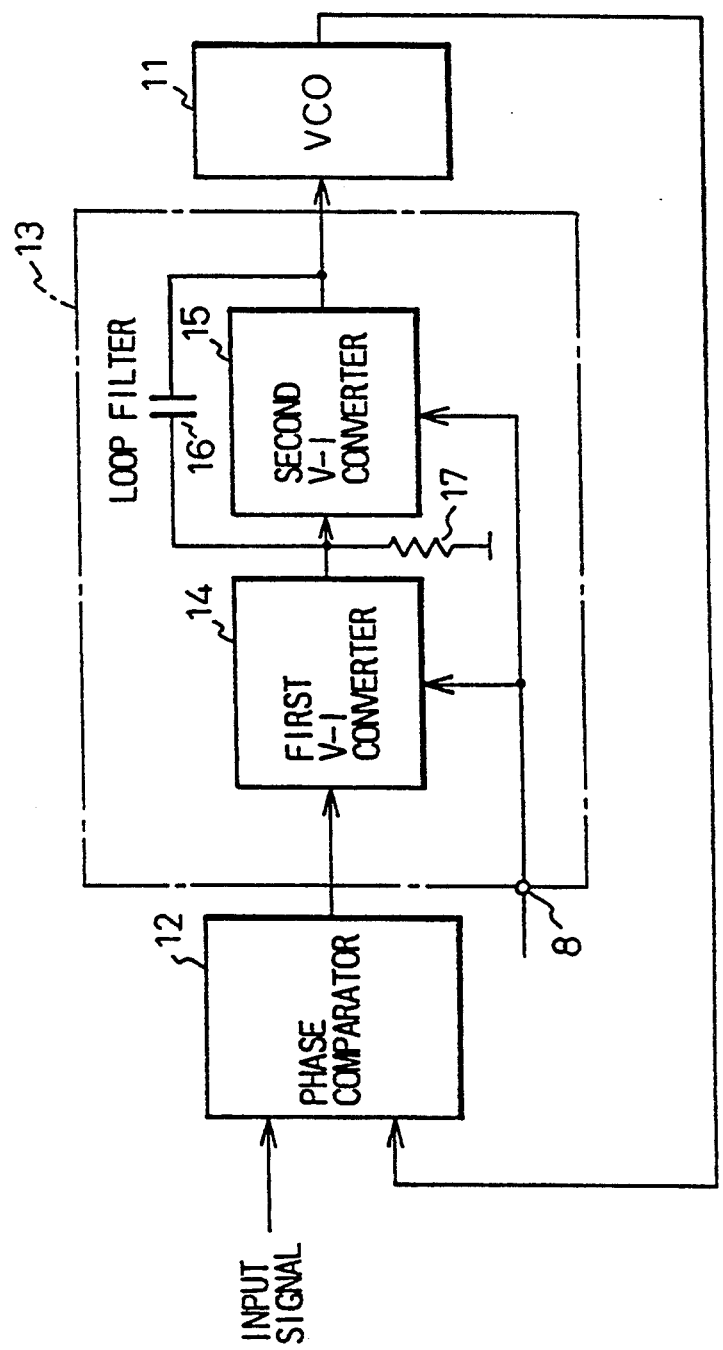

PHASE SYNCHRONIZATION CIRCUIT HAVING A LOOP FILTER INCLUDING TWO VOLTAGE/CURRENT CONVERTERS

BACKGROUND OF THE INVENTION

1. Field of the Invention

The present invention relates to a phase synchronization circuit used for generating a clock signal from an input signal.

2. Description of the Related Art

In recent years, a phase synchronization circuit has been used to generate a clock signal from an input signal. For example, a clock signal is generated, by using the phase synchronous circuit, from an input data signal read by a magnetic head in a magnetic disk drive.

Generally, the phase synchronization circuit is comprised of a phase comparator, a loop-filter, and a VCO (voltage-controlled oscillator). The phase comparator compares the phase of an output signal of the VCO with that of an input signal. An output signal of the phase comparator is provided to the loop filter, which provides a control voltage to the VCO. The loop filter may have various structures depending on the arrangement of the phase comparator.

In the loop filter having a charge pump circuit, a capacitor, and a resistor, the charge pump circuit controls the charging and discharging of the capacitor in response to an output signal of the phase comparator whose pulse width corresponds to a phase difference between the output signal of the VCO and the input signal. A charge voltage on the capacitor serves as the control voltage for the VCO. Since this control voltage controls the phase (frequency) of the output signal of the VCO, the phase of the output signal of the VCO is synchronized with that of the input signal.

The input signal is formed, for example, by reading a magnetic disk with a head of a magnetic disk drive and by shaping the read signal according to zero-crossing points and peaks of the signal. The VCO provides a clock signal whose phase is in synchronization with that of the input signal. According to the clock signal, the signal read through the head is processed to reproduce data.

By the way, some magnetic disk drives employ a zone bit recording method that arranges more sectors in outer tracks than in inner tracks to increase storage capacity. According to this method, the clock frequency used when accessing inner tracks differs from that used when accessing outer tracks.

When generating a clock signal with the phase synchronization circuit in a magnetic disk unit employing the zone bit recording method, the frequency of an input signal may fluctuate, and the output signal of the VCO must follow such fluctuations. Accordingly, the charge pump circuit may change the charging or discharging current of the capacitor. This results in changing the damping factor of the phase synchronization loop, and this destabilizes the phase synchronization operation.

In order to generate a stabilized clock signal with such fluctuating clock frequencies, it is necessary for the phase synchronization circuit to provide a plurality of loop filters for the different frequencies, and to select a suitable loop filter by switching in accordance with the frequency. This may cause the construction of the phase synchronization circuit to be complicated and to increase the cost of the circuit.

SUMMARY OF THE INVENTION

The object of the present invention is to provide a phase synchronization circuit that can realize phase synchronization without changing the damping factor even if the frequency of an input signal fluctuates.

According to one aspect of the present invention, there is provided a phase synchronization circuit having a voltage-controlled oscillator, a phase comparator for comparing the phase of an input signal with that of an output signal of the voltage-controlled oscillator, and a loop filter for receiving an output signal of the phase comparator and providing a control voltage to the voltage-controlled oscillator. The loop filter has a first voltage-current converter for receiving the output signal of the phase comparator, a second voltage-current converter for receiving an output signal of the first voltage-current converter, a capacitor connected between input and output terminals of the first voltage-current converter, and a resistor for converting an output signal of the second voltage-current converter into the control voltage for the voltage-controlled oscillator.

The phase synchronization circuit may have a distributor for changing, according to a cut-off frequency, the ratio between control currents supplied from a reference current source to input and output stages of a current multiplier of each of the first and second voltage-current converters.

The phase synchronization circuit may have a distributor for changing, according to a cut-off frequency, the ratio between control currents that are supplied from a reference current source to input and output stages of a current multiplier of each of the first and second voltage-current converters, and an adder disposed between the loop filter and the VCO. to change the center frequency of the VCO according to the cut-off frequency.

The phase synchronization circuit may have a structure for changing, according to a cut-off frequency, the ratio between control currents supplied from a reference current source and distributed by a distributor to current multipliers of the first and second voltage-current converters, a center frequency controlling offset voltage applied to an adder disposed between the loop filter and the VCO, and a current supplied to a charge pump circuit connected between the phase comparator and the loop filter.

The phase synchronization circuit may have a first distributor for changing, according to a cut-off frequency, the ratio between control currents that are supplied from a reference current source to input and output stages of a current multiplier of each of the first and second voltage-current converters, and a second distributor for changing the ratio between the control currents supplied to the input and output stages of each of the current multipliers, to shorten the acquisition time when the frequency of the input signal is changed.

Each of the first and second voltage-current converters for converting an input voltage into a current has a current multiplier. The first voltage-current converter converts an output signal from the phase comparator into a current to charge and discharge the capacitor connected between the input and output terminals of the first voltage-current converter. The second voltage-current converter converts a charge voltage of a capacitor into a current. A voltage corresponding to the product of the current and the resistance of the resistor is the control voltage that controls the VCO. A control terminal provides a control signal in response to a change in the frequency of the input signal. According to the control signal, the transconductances of the voltage-current converters are changed to change the control voltage for the VCO, thereby changing the frequency of the output signal of the VCO. The transconductances are changed by changing the ratio between the control currents supplied to the input and output stages of each of the voltage-current converters without changing a damping factor.

The control currents to the current multipliers of the first and second voltage-current converters are supplied from the reference current source. The distributor changes the ratio between the control currents supplied to the input and output stages, so that the ratio maintains a predetermined value even if the source voltage and temperature fluctuate.

In addition to the change of the ratio between the control currents being changed by the distributor, the center frequency of the VCO may be changed by adding an offset voltage. This results in adjusting the frequency of the output signal of the VCO to the frequency of the input signal that may fluctuate, thereby improving the phase synchronization speed of the phase synchronization loop.

When the output signal of the phase comparator is applied to the charge pump circuit, the current to the charge pump circuit may be changed to change the charge voltage of the capacitor. This results in changing the control voltage to the VCO. At the same time, the ratio between the control currents supplied to the input and output stages of the current multiplier of each of the first and second voltage-current converters may be changed to change the control voltage to the VCO. An offset voltage may be added to the output voltage of the loop filter, to change the control voltage to the VCO. These actions may be simultaneously carried out according to a cut-off frequency, to speedily adjust the frequency of the output signal of the VCO.

The control current to the input stages of the current multipliers of the first and second voltage-current converters may be increased to increase the transconductance and shorten the acquisition time. The transconductance may be temporarily increased when the ratio between the control currents to the input and output stages of each of the current multipliers is changed according to a cut-off frequency, to shorten an acquisition time. Namely, the first and second distributors are controlled to change the ratio between the control currents to the input and output stages of each of the current multipliers according to the cut-off frequency, to thereby speedily adjust the frequency of the output signal of the VCO.

BRIEF DESCRIPTION OF THE DRAWINGS

The present invention will be more clearly understood from the description as set forth below with reference to the accompanying drawings, wherein:

FIG. 17 is a block circuit diagram showing an eleventh embodiment of a phase synchronization circuit according to the present invention.

DESCRIPTION OF THE PREFERRED EMBODIMENTS

Before describing the preferred embodiments, an explanation will be given of the conventional phase synchronous circuit shown in FIG. 1.

Figure 1:
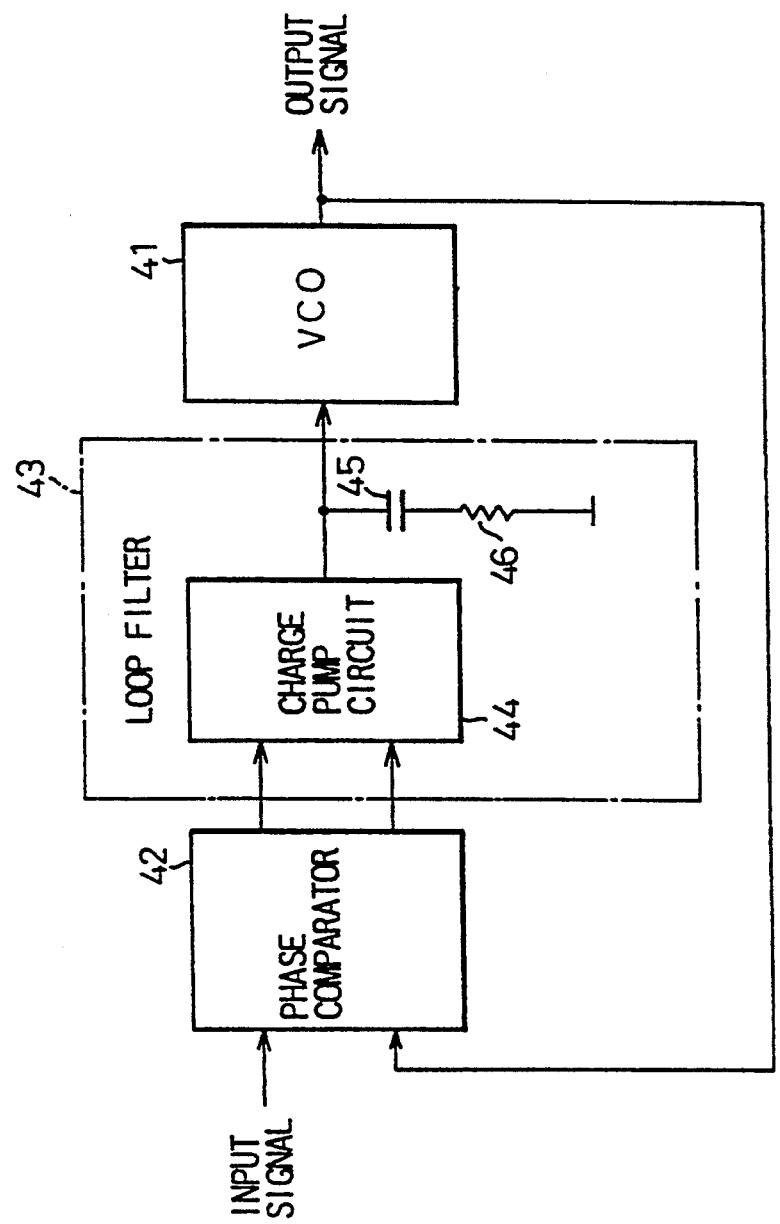
FIG. 1 is a prior art circuit block diagram of a phase synchronization circuit.

FIG. 1 shows an example of a conventional phase synchronization circuit. A phase comparator 42 compares the phase of an output signal of a voltage-controlled oscillator (VCO) 41 with that of an input signal. The phase comparator 42 outputs pulse-width-modulated signal in accordance with a phase difference between the output signal of the VCO and the input signal. The output signal of the phase comparator 42 is input to a loop filter 43, which provides a control voltage to the VCO 41. The loop filter 43 may have various structures depending on the arrangement of the phase comparator 42. The loop filter of this example has a charge pump circuit 44 for changing the input pulse-width-modulated signal into a voltage, a capacitor 45, and a resistor 46. The capacitor 45 and the resistor 46 are connected in series between an output terminal of the charge pump circuit 44 and ground. The construction of the charge pump circuit 44 is well-known, so that a disclosure thereof is omitted.

The charge pump circuit 44 controls the charging and discharging of the capacitor 45 in response to an output signal from the phase comparator 42 whose pulse width corresponds to a phase difference between the output signal of the VCO 41 and the input signal. A charge voltage on the capacitor 45 serves as the control voltage for the VCO 41. Since this control voltage controls the phase (frequency) of the output signal of the VCO 41, the phase of the output signal of the VCO 41 is synchronized with that of the input signal.

The input signal is formed, for example, by reading a magnetic disk with a head of a magnetic disk drive and by shaping the read signal according to the zero-crossing points and peaks of the signal. The VCO 41 provides a clock signal whose phase is in synchronization with that of the input signal. According to the clock signal, the signal read through the head is processed to reproduce data.

When generating a clock signal with the phase synchronization circuit in a magnetic disk drive employing the zone bit recording method, the frequency of an input signal may fluctuate, and the output signal of the VCO 41 must follow such fluctuations. The reason why such fluctuations occur is that a frequency of the data read from an outer track of the disk and a frequency of the data read from an inner track of the disk are different, since the outer track area and the inner track area on the magnetic disk involve different numbers of sectors in the magnetic disk drive employing the zone bit recording method.

In this case, the charge pump circuit 44 should change the charging or discharging current of the capacitor 45, since a cut-off frequency and the center frequency of the VCO 41 depends on the frequency of the input data. This results in changing the damping factor of the phase synchronization loop, and this destabilizes the phase synchronization operation.

Figure 2:
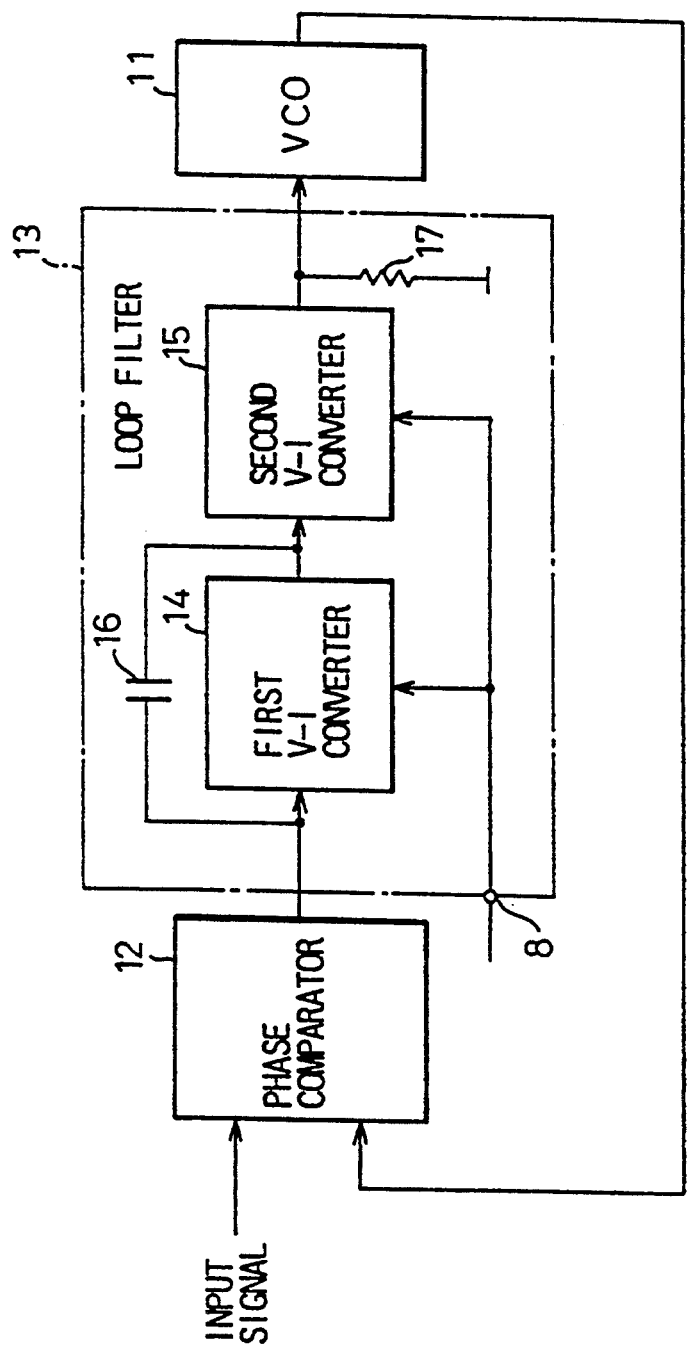
FIG. 2 is a block circuit diagram showing a fundamental construction of a phase synchronization circuit according to the present invention.

FIG. 2 is a block circuit diagram showing a fundamental construction of a phase synchronization circuit according to the present invention. The phase synchronization circuit of the present invention basically includes a VCO (voltage-controlled oscillator) 11, a phase comparator 12 for comparing the phase of an input signal with that of an output signal of the VCO 11, and a loop filter 13 for receiving an output signal of the phase comparator and providing a control voltage for the VCO 11. The loop filter 13 has a first voltage-current converter 14 for receiving the output signal of the phase comparator 12, a second voltage-current converter 15 for receiving an output signal of the first voltage-current converter 14, a capacitor 16 connected between input and output terminals of the first voltage-current converter 14, and a resistor 17 for converting an output signal of the second voltage-current converter 15 into the control voltage for the VCO 11. The loop filter 13 has a control terminal 8 for receiving a control signal to control the first and the second voltage-current converters S14 and 15.

A preferred embodiment according to the present invention will be now explained hereinafter with reference to FIGS. 3 to 16. The same reference numerals showing the same element as used in FIG. 2 are used in FIGS. 3 to 16.

Figure 3:
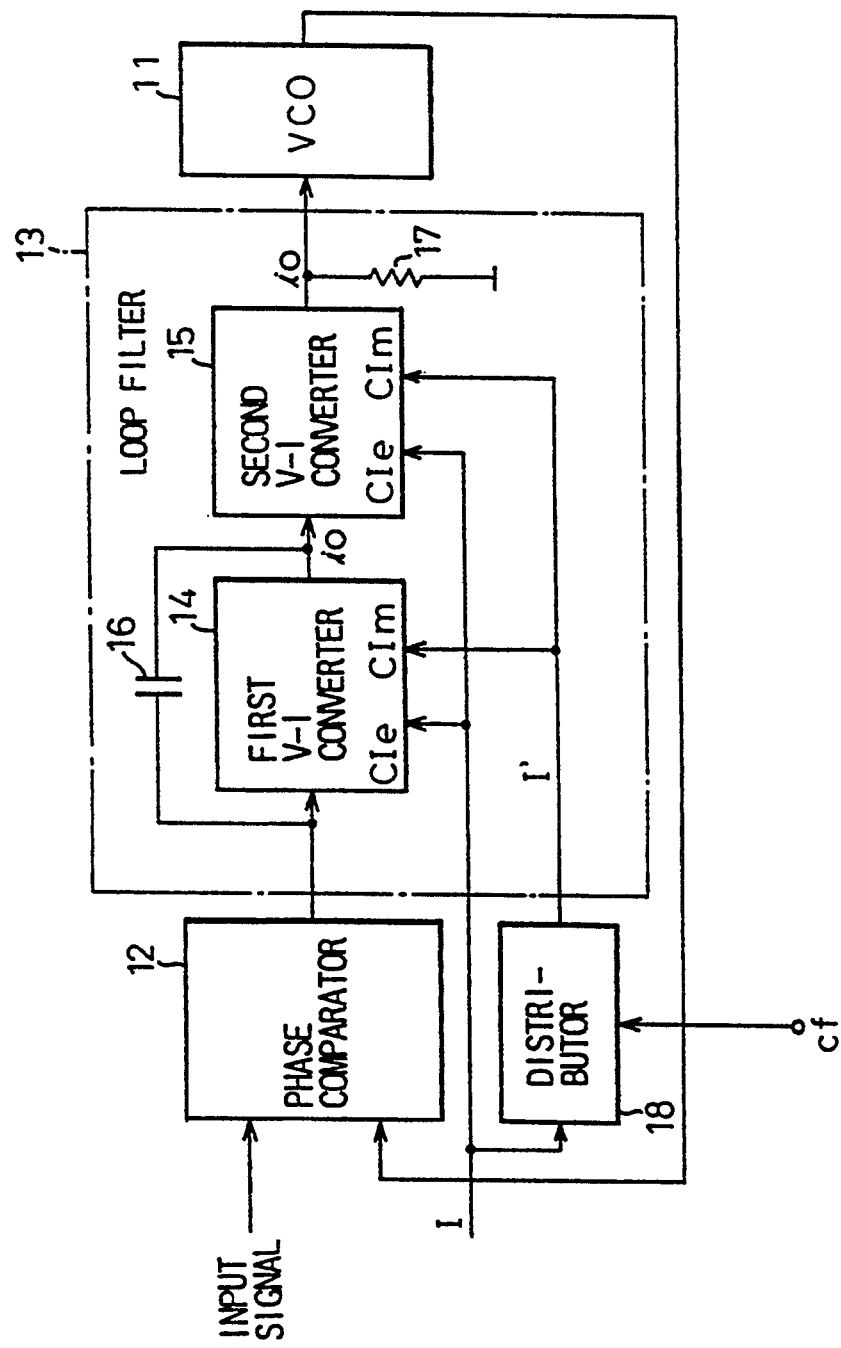
FIG. 3 is a block circuit diagram showing a first embodiment of a phase synchronization circuit according to the present invention.

FIG. 3 explains a first embodiment of the present invention. Numeral 11 is a VCO, 12 is a phase comparator, 13 is a loop filter, 14 and 15 are first and second voltage-current converters, 16 is a capacitor, 17 is a resistor, and 18 is a distributor. The first and the second voltage-current converters 14 and 15 have a control terminal CIe and CIm respectively. A control current I is input to each control terminal CIe, and a control current I' is input to each control terminal CIm. The control current I' is generated by the distributor 18. The distributor 18 changes the ratio between a control current I and a control current I' according to a cut-off frequency control signal cf.

Figure 4:
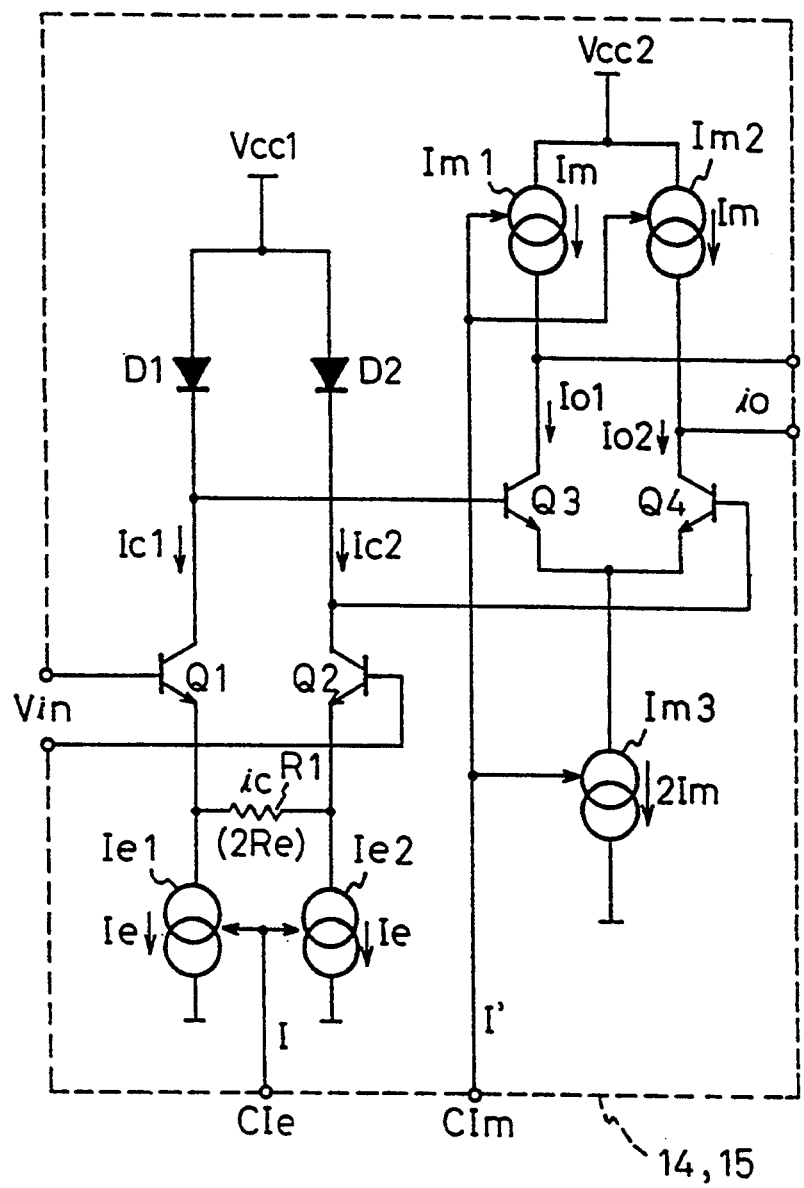
FIG. 4 is a circuit diagram showing one circuit example of a voltage-current converter in FIG. 3.

FIG. 4 shows an example of the current multiplier employed in each of the voltage-current converters 14 and 15. Reference marks D1 and D2 are diodes, Q1 to Q4 are transistors, R1 is a resistor having a resistance of 2 Re $\Omega$, CIe and CIm are control terminals, and Ie, Im, and 2Im are currents from constant current sources Ie1, Ie2, Im1, Im2, and Im3. The resistance 2 Re means that there are series-connected two resistors having a resistance of Re. The voltage-current converters 14 and 15 are comprised of input stages including the diodes D1 and D2, the transistors Q1 and Q2, the resister R1, and two current sources Ie1 and Ie2, and output stages including the transistors Q3 and Q4, and three current sources Im1, Im2, and Im3.

The distributor 18 in FIG. 3 changes the ratio between a control current I for input stages and a control current I' for output stages of the current multipliers of the voltage-current converters 14 and 15 according to a cut-off frequency control signal cf. The current Ie for the input stage is controlled according to the control current I from the control terminal CIe, and the current Im for the output stage is controlled according to the control current I' from the control terminal CIm.

Reference marks Vcc1 and Vcc2 in FIG. 4 are source voltages, Vin is an input voltage, and io is an output current. The transistors Q1 and Q2 form the input stage of the current multiplier, and the transistors Q3 and Q4 form the output stage thereof. The output current io of the first voltage-current converter 14 is applied to the capacitor 16 as shown in FIG. 3. A charge voltage of the capacitor 16 is the input voltage Vin to the second voltage-current converter 15. The output current io of the second voltage-current converter 15 is applied to the resistor 17, which provides the control voltage for the VCO 11.

Each of the transistors Q1 to Q4 in FIG. 4 has a voltage gain of 1 and an emitter resistance of re $\Omega$. The resistor R1 is selected to be re<<Re and is connected between emitters of the transistors Q1 and Q2. When the input voltage Vin is applied to bases of the transistors Q1 and Q2, a current ic flowing through the resistor R1 will be as follows:

$$ic = Vin/2\,Re \tag{1}$$

When collector currents of the transistors Q1 and Q2 are Ic1 and Ic2, respectively, an anode potential difference Va between the diodes D1 and D2 is as follows:

$$\Delta V_a = [Vcc1 - VT\log(Ic1/Is)] - [Vcc1 - VT\log(Ic2/Is)] = VT\log[(Ie-ic)/(Ie+ic)] \tag{2}$$

where VT=kT/q, k is Boltzmann's constant, T is the absolute temperature, q is electron charge, and Is is a diode's saturation current.

When collector currents of the transistors Q3 and Q4 are Io1 and Io2, respectively, a base potential difference $\Delta Vb$ is as follows:

$$\Delta Vb = VT\log(Io1/Is) - VT\log(Io2/Is) = VT\log(Im-io)/(Im+io) \quad (3)$$

Since a $\Delta Vb = \Delta Vb$, the following is derived from the expressions (2) and (3):

$$(Ie-ic)/(Ie+ic) = (Im-io)/(Im+io)$$

Then, the output current io is solved as follows:

$$io = (Im/Ie)ic \quad (4)$$

The following is derived from the expression (1):

$$io = (Im Vin)/(IeRe) \quad (5)$$

Accordingly, an input-output relationship in each of the voltage-current converters will be as follows:

$$io/Vin = Im/ReIe \quad (6)$$

A transconductance gm is defined as follows:

$$gm = Im(ReIe) \quad (7)$$

When the current Im for the output stage is decreased, or when the Ie for the input stage is increased, the transconductance gm becomes larger. Changing the ratio (Im/Ie) between the currents changes the transconductance gm. For example, the current Im can be controlled according to the control current I' from the control terminal CIm, to change the transconductance gm.

In the embodiment of FIG. 3, the current I from a reference current source (not shown) is supplied to the control terminal CIe to control the current Ie to the input stage of the current multiplier of each of the first and second voltage-current converters 14 and 15. This control current I is divided and is passed through the distributor 18 to provide the control current I'. The control current I' is supplied to the control terminal CIm to control the current Im for the output stage of the current multiplier of each of the first and second voltage-current converters 14 and 15.

The distributor 18 is controlled according to the cut-off frequency control signal cf, to change the control current I'. In this way, the control current Im is changed to change the transconductance gm, to thereby change the control voltage for the VCO 11. Consequently, the frequency of the output signal of the VCO 11 quickly follows a change in the cut-off frequency.

When the capacitor 16 has capacitance C and the resistor 17 has resistance R $\Omega$, a transfer function F(s) of the loop filter 13 is expressed as follows:

$$F(s) = [(1+(gm/CS)]gmR \quad (8)$$

This is a complete integration second-order loop.

When the phase comparator 12 has a gain of Kd and the VCO 11 has a gain of Kv, a transfer function H(s) of the phase synchronization circuit is expressed as follows:

$$H(s) = [KdKvgmR\{S+(gm/C)\}]/[S^2+KdKvgmR\{S+(gm/C)\}] \quad (9)$$

When the expression (9) is expanded for S, a natural frequency $\omega n$ and a damping factor $\xi$ will be as follows:

$$\omega n = (KdKvR/C)^{\frac{1}{2}} \times gm \quad (10)$$

$$\xi = (KdKvRC)^{\frac{1}{2}} \div 2 \quad (11)$$

As is apparent in the expression (11), the loop filter 13 employing the voltage-current converters 14 and 15 is capable of maintaining the damping factor $\xi$ without regard to the frequency of the input signal. When the frequency of the input signal is greatly changed, the control signal cf controls the distributor 18 to change the ratio of the current Im to the current Ie, thereby changing the transconductance gm of the voltage-current converters 14 and 15 and synchronizing the frequency of the output signal from the VCO 11 with the frequency of the input signal. Even if the phase synchronization frequency $\omega n$ in the phase synchronization circuit is changed, the damping factor $\xi$ is unchanged to stabilize the phase synchronization. Since the currents Ie and Im are obtained from the control current I from the reference current source, the ratio between the currents Ie and Im is maintained even if the source voltage and temperature fluctuate, to stabilize the phase synchronization.

Figure 5:
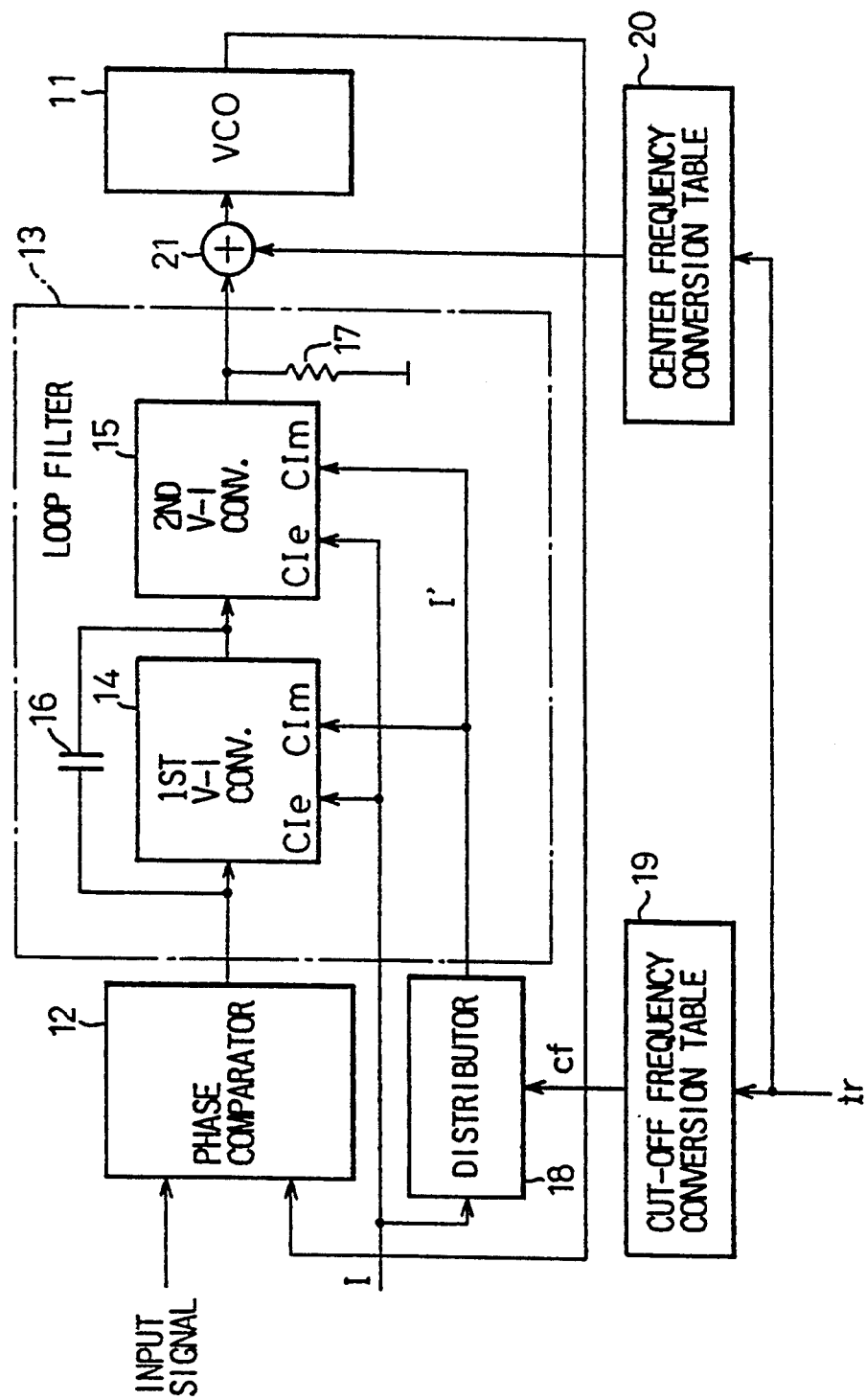
FIG. 5 is a block circuit diagram showing a second embodiment of a phase synchronization circuit according to the present invention.

FIG. 5 explains a second embodiment of the present invention. Numeral 19 is a cut-off frequency conversion table, 20 is a center frequency conversion table, and 21 is an adder. In the figure, the same reference marks as those of FIG. 2 represent the same parts. The second embodiment is applicable for generating a clock signal in a magnetic disk drive employing the zone bit recording method. Head position data tr indicating the position of a head on a magnetic disk is supplied to the cut-off frequency conversion table 19 and center frequency conversion table 20. An outer track area and an inner track area on the magnetic disk involve different numbers of sectors. Depending on whether the head is positioned in the outer track area or in the inner track area, a cut-off frequency and the center frequency of the VCO 11 are determined. A current I from the reference current source forms a control current Ie for the input stage of the current multiplier of each of the first and second voltage-current converters 14 and 15. The current I is supplied to the distributor 18, which provides a control current I' supplied to the control terminal CIm. The current Im for the output stage of the current multiplier of each of the first and second voltage-current converters 14 and 15 is controlled by the control current I'.

When the head is moved from the inner track area to the outer track area, the clock frequency increases. In this case, according to the head position data tr, the cut-off frequency conversion table 19 provides a control signal cf to the distributor 18, to decrease the control current Im, while the center frequency conversion table 20 provides an offset voltage to the adder 21, to increase the center frequency of the VCO 11. The change in the center frequency by the offset voltage and the change in the transconductance gm of the loop filter 13 simultaneously occur, to quickly synchronize the phase of the output signal of the VCO 11 with the phase of the input signal whose frequency has been increased. When the head is moved from the outer track area to the inner track area, an offset voltage is applied to the adder 21 to decrease the center frequency of the VCO 11. At the same time, the control current from the distributor 18 is increased to decrease the transconductance gm of the loop filter 13. As a result, the frequency of the output signal of the VCO 11 is quickly synchronized with the changed frequency of the input signal.

Figure 6:
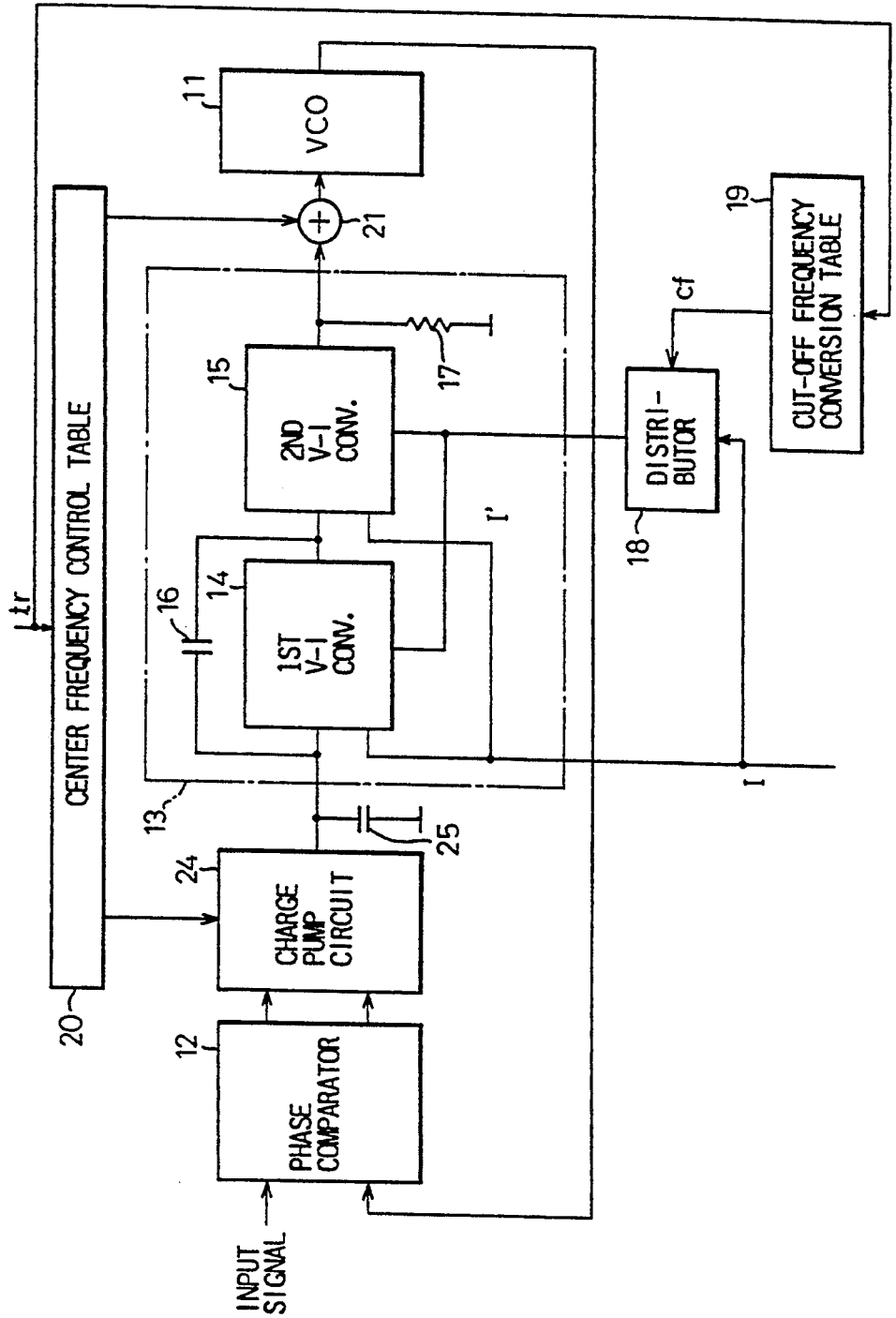
FIG. 6 is a block circuit diagram showing a third embodiment of a phase synchronization circuit according to the present invention.

FIG. 6 explains a third embodiment of the present invention. Numeral 20 is a center frequency control table, 24 is a charge pump circuit, and 25 is a capacitor. In the figure, the same reference marks as those of FIG. 4 represent the same parts. In this embodiment, the phase comparator 12 outputs pulse-width-modulated signal in accordance with a phase difference between the output signal of the VCO 11 and the input signal similar to the conventional phase comparator 42 as explained in FIG. 1. The output signal from the phase comparator 12 includes an up-signal and down-signal in accordance with the phase lead and phase lag. Accordingly, it is required that the charge pump circuit 24 and the capacitor 25 change the pulse-width-modulated signal into a voltage. The charge pump circuit 24 controls the charging and discharging of the capacitor 25 according to a phase difference, which is provided by the phase comparator 12 as a difference between an output signal of the VCO 11 and an input signal. A charge voltage of the capacitor 25 is an input voltage to the loop filter 13.

According to head position data tr, the center frequency control table 20 controls the current to the charge pump circuit 24 as well as an offset voltage to the adder 21. Namely, the current to the charge pump circuit 24 is changed depending on whether a head is positioned in an outer track area or in an inner track area of a magnetic disk. For example, when the head is in the outer track area, the clock frequency increases, so that the current to the charge pump circuit 24 is increased and the offset voltage to the adder 21 is changed to increase the center frequency of the VCO 11. The cut-off frequency conversion table 19 controls the distributor 18, to change the current Im for the output stage of the current multiplier of each of the first and second voltage-current converters 14 and 15, to thereby change the transconductance gm of the converters. As a result, the VCO 11 quickly generates a clock signal having a new frequency.

Figure 7:
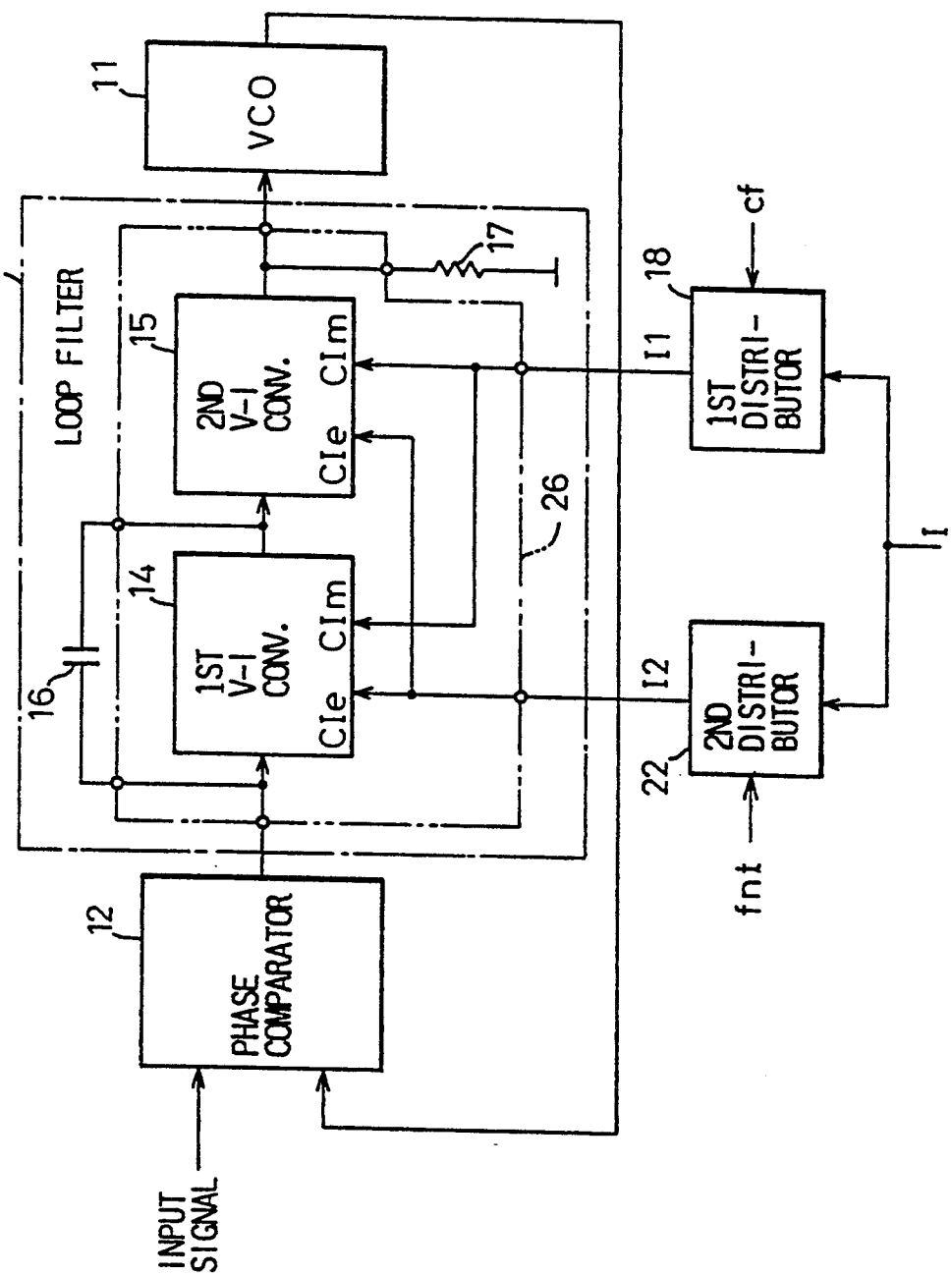
FIG. 7 is a block circuit diagram showing a fourth embodiment of a phase synchronization circuit according to the present invention.

FIG. 7 explains a fourth embodiment of the present invention. In the figure, the same reference marks as those of FIG. 2 represent the same parts. Numeral 18 is a first distributor to supply a control current I1 to the control terminal CIe of the first and the second voltage-current converters 14 and 15. Numeral 22 is a second distributor to supply a control current I2 to the control terminal CIm of the first and the second voltage-current converters 14 and 15. In this embodiment, the first and second voltage-current converters 14 and 15 are formed in an integrated circuit 26. The capacitor 16 and resistor 17 are externally connected to the integrated circuit 26.

A cut-off frequency control signal cf controls the first distributor 18 to produce a control current I1 from the current I provided by the reference current source. A acquisition time control signal fnt controls the second distributor 22 to produce a control current I2 from the current I provided by the reference current source. For example, the control signal fnt increases the control current I2 when a cut-off frequency is changed, to increase the ratio between the currents Ie and Im as shown in FIG. 4. This results in increasing the transconductance gm of the converters 14 and 15, to shorten an acquisition time. After the phase synchronization is completed, the control current I2 returns to the original value.

According to the cut-off frequency control signal cf, the distributor 18 changes the control current I1. As explained with the previous embodiments, whenever the head moves between the outer and inner track areas, a clock frequency changes. To quickly accomplish phase synchronization in response to the change in the clock frequency, the control signal fnt is provided for a predetermined duration, and the control signal cf indicating the magnitude of the clock frequency is produced. These control signals control the first and second distributors 18 and 22 to change the distribution ratio of the current I provided by the reference current source, to thereby quickly achieve phase synchronization in response to the frequency change in the input signal.

As is apparent in the circuit diagram of FIG. 7, the first and second voltage-current converters 14 and 15 are easily integrated into the integrated circuit 26 with the capacitor 16 and resistor 17 being externally connected thereto.

Figure 8:
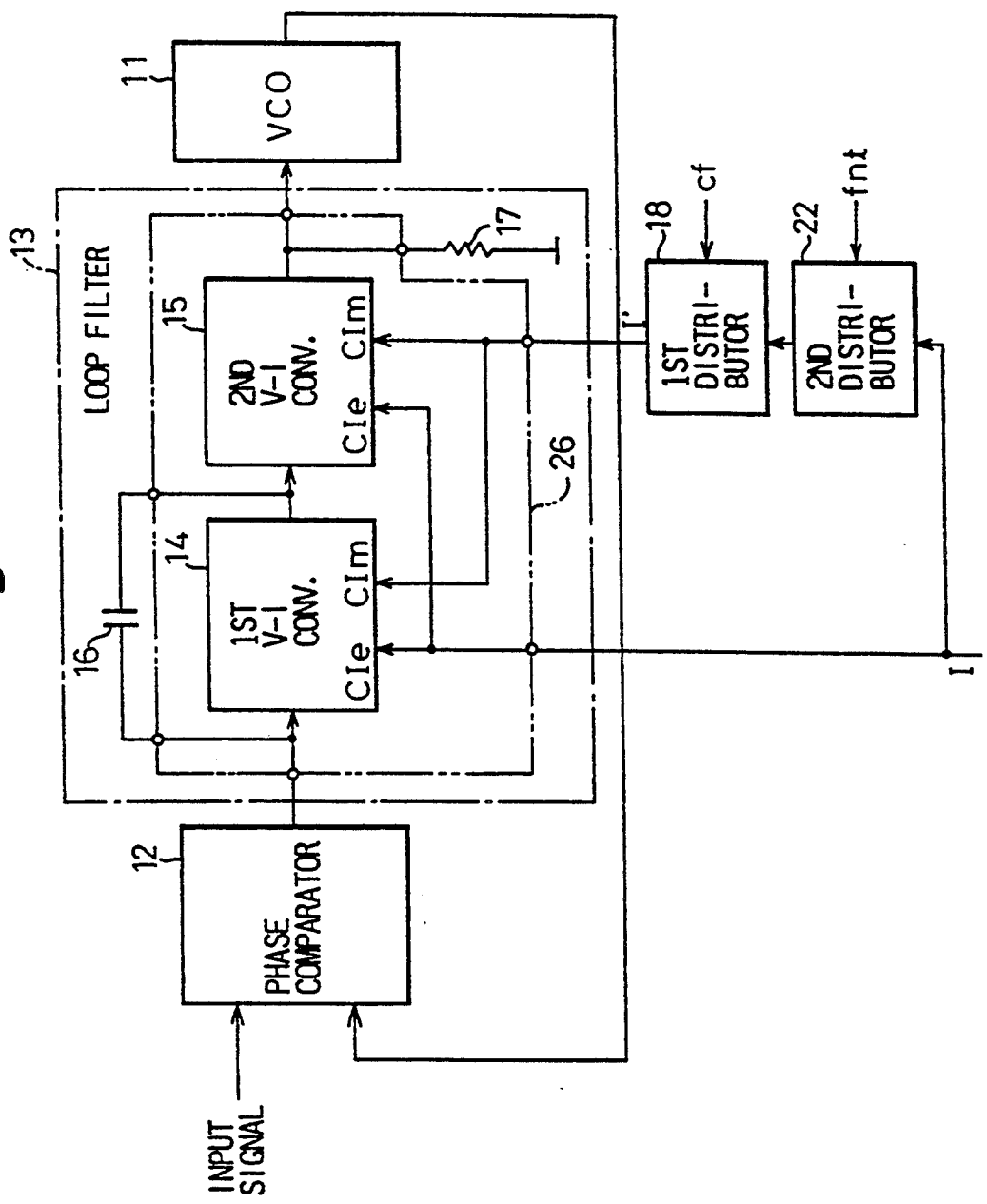
FIG. 8 is a block circuit diagram showing a fifth embodiment of a phase synchronization circuit according to the present invention.

FIG. 8 explains a fifth embodiment of the present invention. In the figure, the same reference marks as those of FIG. 7 represent the same parts. According to the fifth embodiment, the first and second distributors 18 and 22 are connected in series. The cut-off frequency control signal cf is used to control the first distributor 18, and the acquisition time control signal fnt is used to control the second distributor 22, similar to the embodiment of FIG. 7. According to the fifth embodiment, the first and second distributors 18 and 22 control the current Im for the output stage of the current multiplier of each of the first and second voltage-current converters 14 and 15, to change the ratio of the control current I' to the input control current I, to thereby change the transconductance gm of the converters 14 and 15. Namely, the transconductance gm is adjusted according to the frequency of an input signal. In addition, the transconductance gm is adjusted to shorten an acquisition time whenever the frequency of the input signal is changed.

Figure 9:
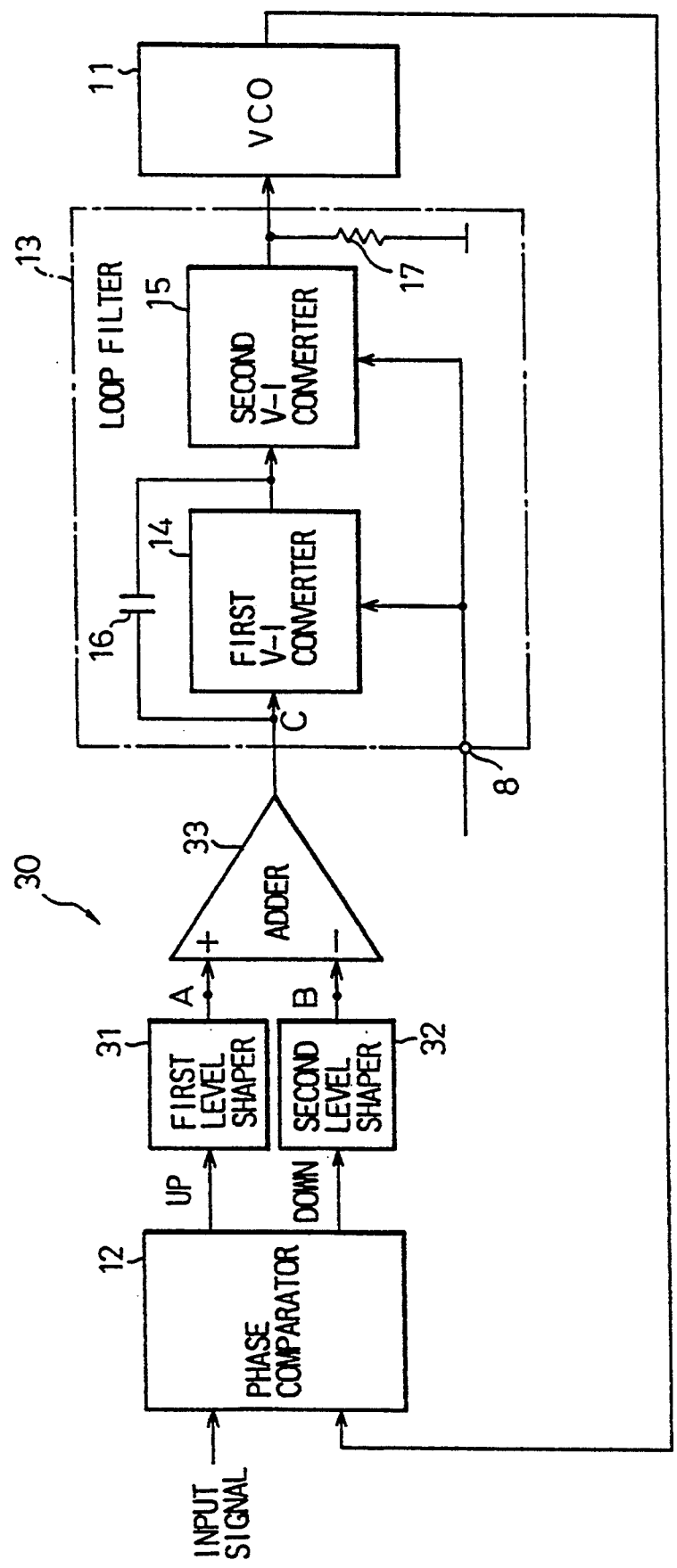
FIG. 9 is a block circuit diagram showing a sixth embodiment of a phase synchronization circuit according to the present invention.

FIG. 9 explains a sixth embodiment of the present invention. In the figure, the same reference marks as explained before represent the same parts. In this embodiment, the phase comparator 12 outputs pulse-width-modulated signal in accordance with a phase difference between the output signal of the VCO 11 and the input signal, similar to the conventional phase comparator 42 and the phase comparator 12 as explained in FIGS. 1 and 6. The output signal from the phase comparator 12 includes an up-signal and down-signal in accordance with the phase lead and phase lag.

The up-signal is output from the phase comparator 12 when the phase of the input signal to the phase comparator 12 is leading to the phase of the output signal from the VCO 11. The up-signal increases the frequency of the VCO 11. Coversely, the down-signal is output from the phase comparator 12 when the phase of the input signal to the phase comparator 12 is lagging to the phase of the output signal from the VCO 11.

Accordingly, there is provided a converting circuit 30 between the phase comparator 12 and the loop filter 13 to change the pulse-width-modulated signal from the phase comparator 12 into a voltage for inputting the same to the loop filter. The converting circuit 30 includes a first level shaper 31, a second level shaper 32, and an adder 33.

The first level shaper 31 shapes (=normalizes the pulse magnitude) an input up-signal into a voltage signal having a constant level of Vo, when the phase comparator 12 detects the phase lead. The second level shaper 32 shapes an input down-signal into a voltage signal having a constant level of Vo, when the phase comparator 12 detects the phase lag. The adder 33 calculates the difference between the input signals at a positive input terminal "+" and a negative input terminal "−".

Figure 10A:
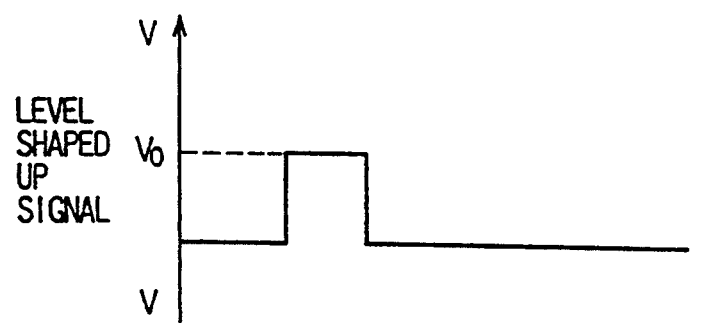
FIG. 10A is a waveform diagram showing a level-shaped up-signal at point A in FIG. 9.
Figure 10B:
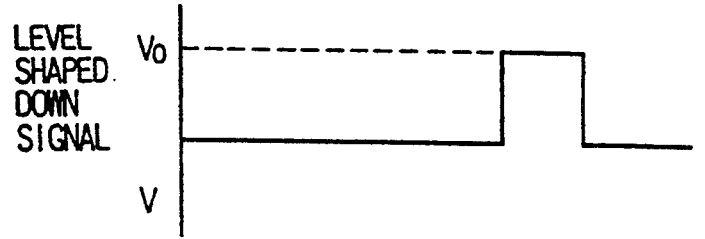
FIG. 10B is a waveform diagram showing a level-shaped down-signal at point B in FIG. 9.
Figure 10C:
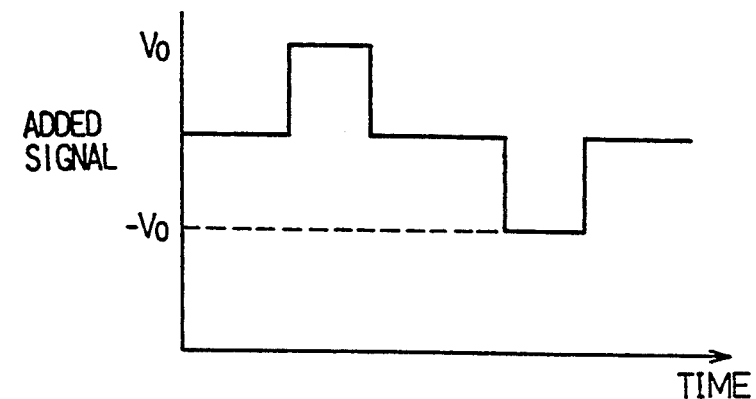
FIG. 10C is a waveform diagram showing the added signal at point C in FIG. 9.

FIG. 10A shows the waveform of a level-shaped up-signal output from the first level shaper 31 at point A in FIG. 9. FIG. 10B shows the waveform of a level-shaped-down-signal output from the second level shaper 32 at point B in FIG. 9. FIG. 10C shows the waveform of an added signal at point C in FIG. 9.

Figure 11:
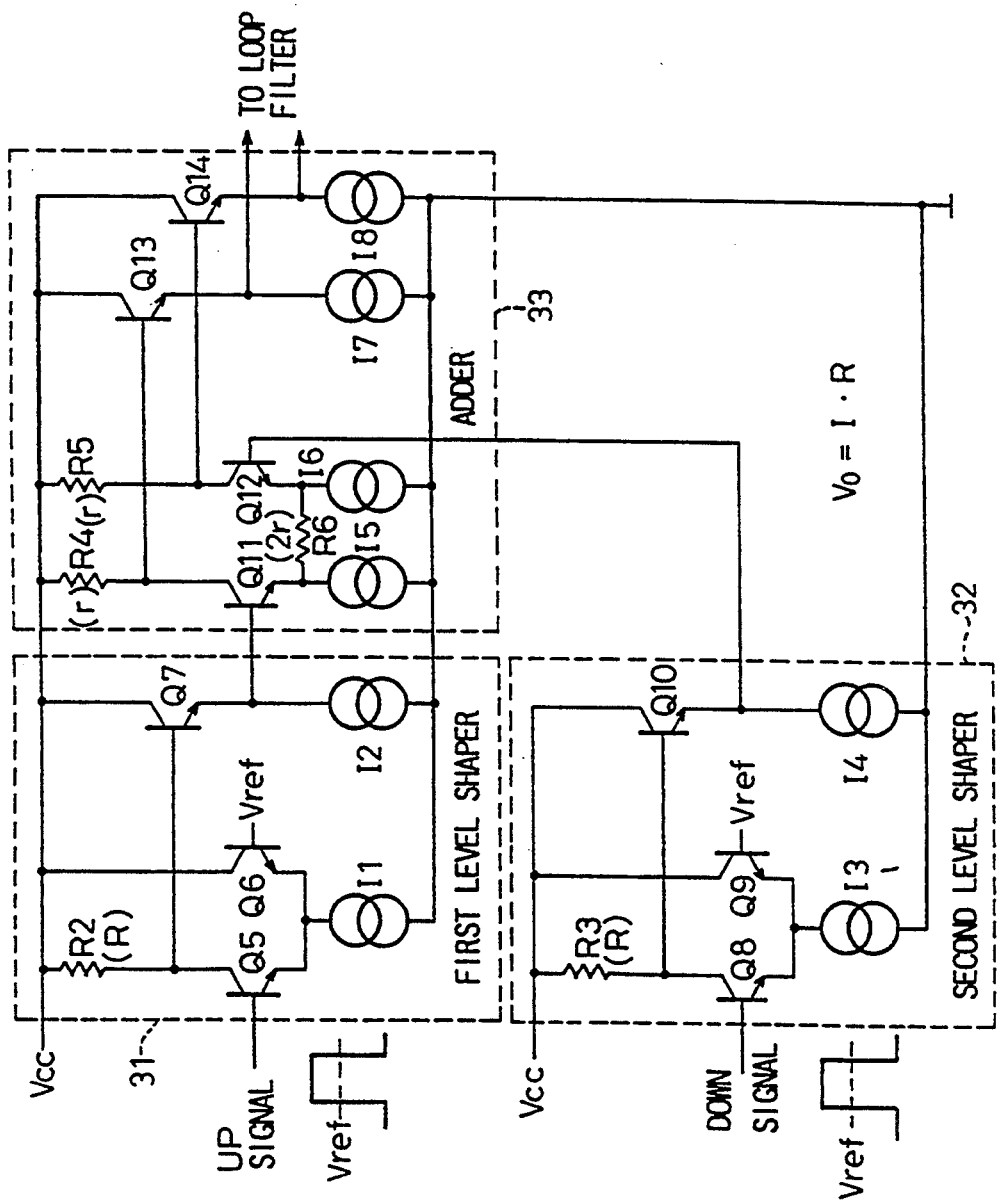
FIG. 11 is a circuit diagram showing one circuit example of a first level shaper, a second level shaper, and an adder in FIG. 9.

FIG. 11 shows an example of the first level shaper 31, the second level shaper 32, and the adder 33 in FIG. 9. Reference marks Q5 to Q14 are transistors, R2, R3, R4, and R6 are resistors having resistance of R, R, r, r, and 2 r Ω respectively, and I1 to I8 are constant current sources. The first level shaper 31 is comprised of three transistors Q5 to Q7, a resistor R2 having a resistance R Ω, and two current sources I1 and I2. The second level shaper 32 is comprised of three transistors Q8 to Q10, a resister R3 having a resistance R Ω, and two current sources I3 and I4. The adder 33 is comprised of four transistors Q11 to Q14, three resistors R4, R5, and R6 having a resistance r, r, and 2 r Ω respectively, and four current sources I5 to I8.

The transistor Q5 turns on when the up-signal is input to the base thereof, and a current I1 flows through the resistor R2, thereby a voltage level of a base of the transistor Q7 decreases by R*I1 volts. In this case, an output voltage from the first level shaper 31 will be (Vcc−R*I1−$V_{BE}$). When a magnitude of the up-signal is smaller than the reference voltage, an output voltage from the first level shaper 31 will be (Vcc−$V_{BE}$).

The operation of the second level shaper 32 is the same as that of the first level shapter 31, so that the operation thereof will be omitted. The adder 33 calculates a difference between the level-shaped up-signal and the level-shaped down-signal.

Figure 12:
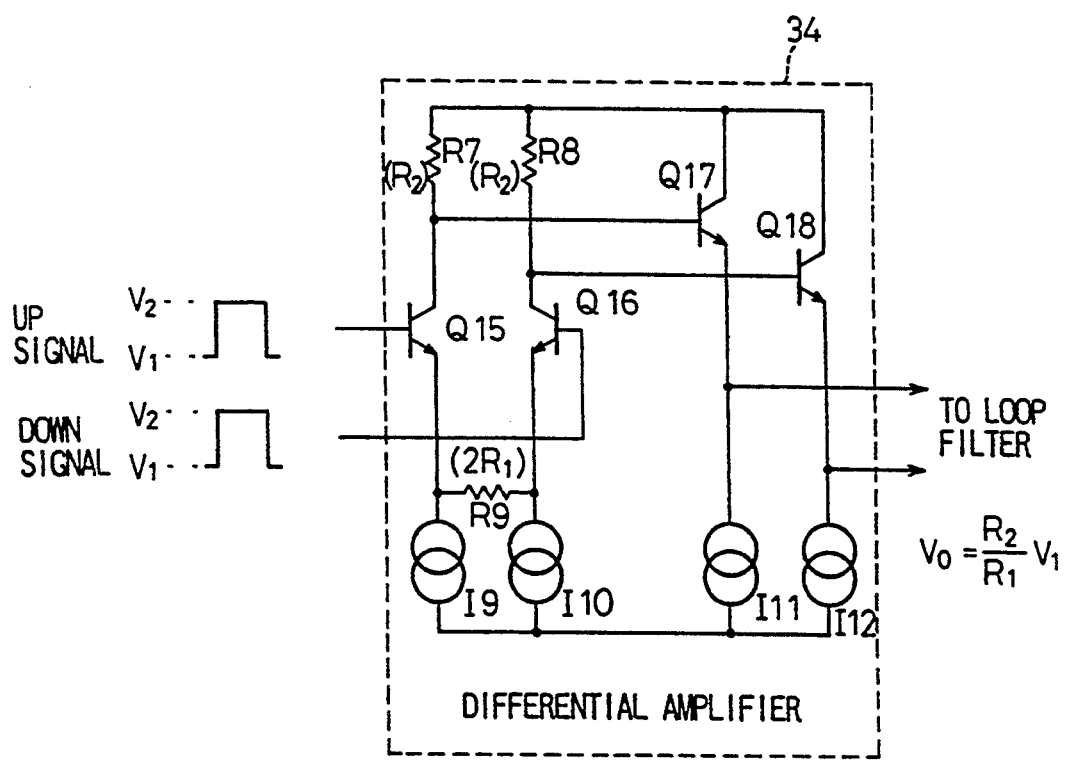
FIG. 12 is a circuit diagram showing one integrated circuit example of a differential amplifier having a function of a first level shaper, a second level shaper, and an adder in FIG. 9.

The first and the second level shaper 31 and 32, and the adder 33 can be formed in an integrated circuit as a differential amplifier 34 as shown in FIG. 12. In FIG. 12, the differential amplifier 34 is comprised of four transistors Q15 to Q18, three resistors R7, R8, and R9 having a resistance of R, R, and 2 R$_1$ Ω respectively, and four current sources I9 to I12.

Figure 13:
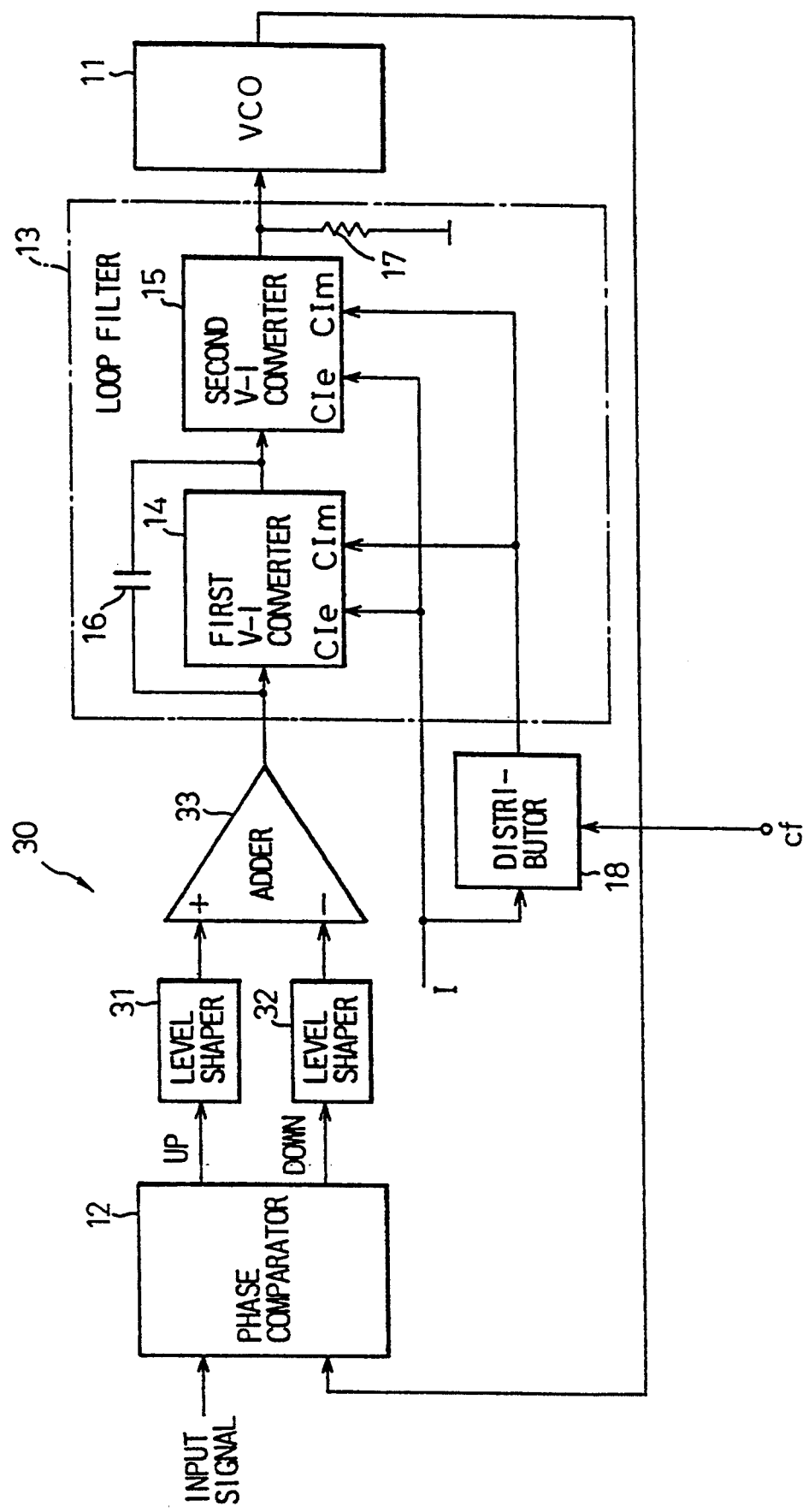
FIG. 13 is a block circuit diagram showing a seventh embodiment of a phase synchronization circuit according to the present invention.

FIG. 13 explains a seventh embodiment of the present invention. In this embodiment, the above-described converting circuit 30 including the first level shaper 31, the second level shaper 32, and the adder 33 is inserted between the phase comparator 12 and the loop filter 13 of the phase synchronization circuit shown in FIG. 3.

Figure 14:
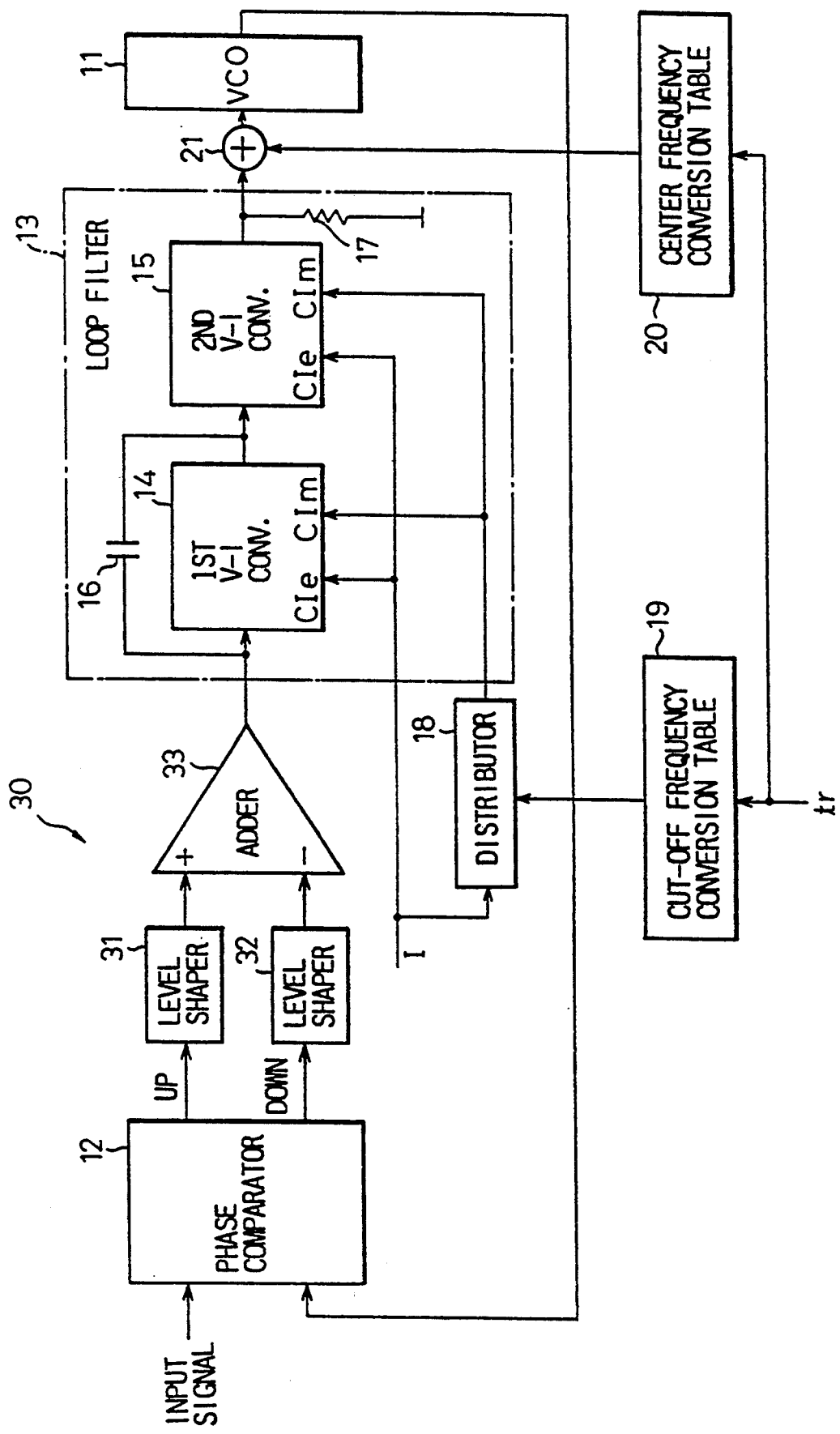
FIG. 14 is a block circuit diagram showing a eighth embodiment of a phase synchronization circuit according to the present invention.

FIG. 14 explains a eighth embodiment of the present invention. In this embodiment, the above-described converting circuit 30 including the first level shaper 31, the second level shaper 32, and the adder 33 is inserted between the phase comparator 12 and the loop filter 13 of the phase synchronization circuit shown in FIG. 5.

Figure 15:
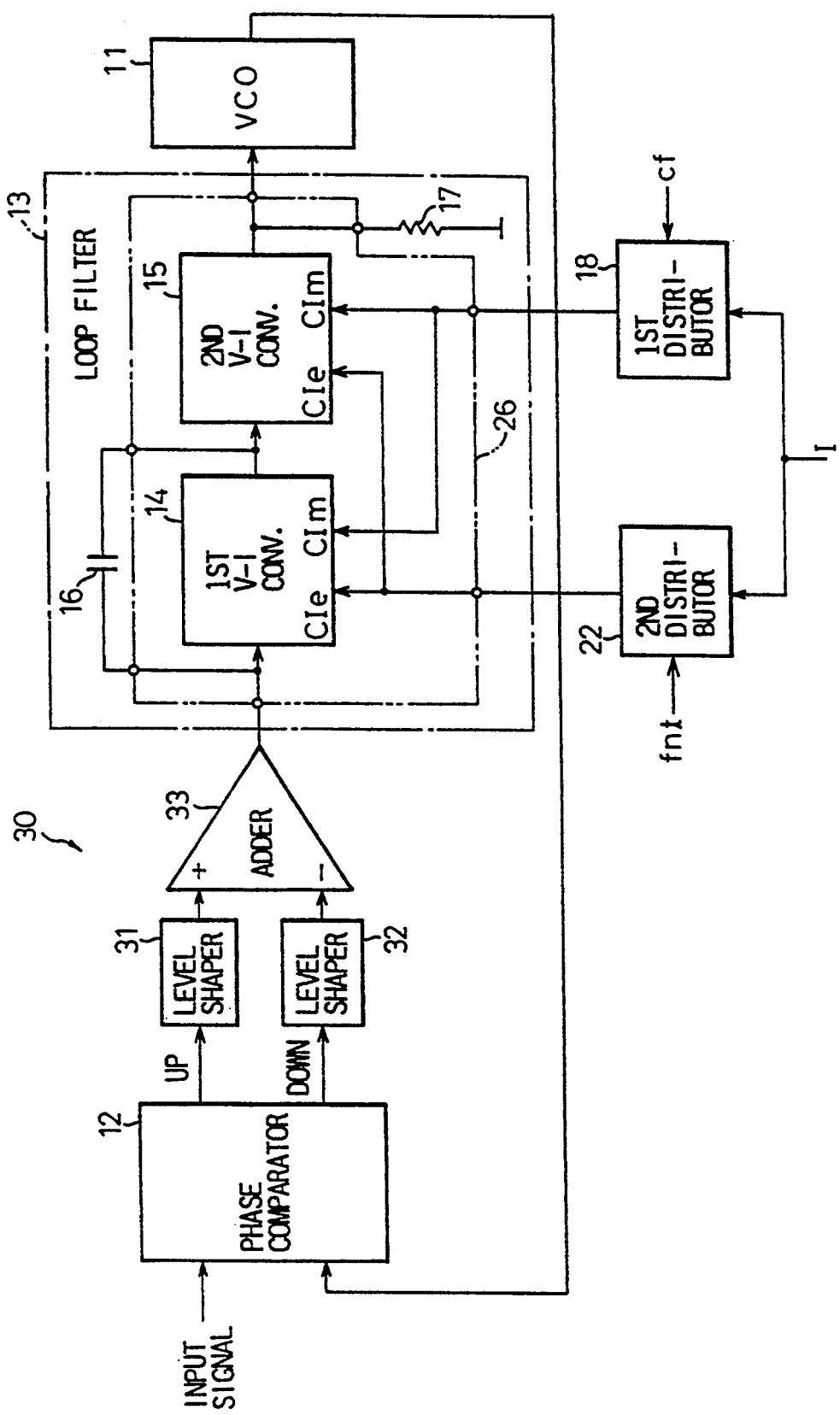
FIG. 15 is a block circuit diagram showing a ninth embodiment of a phase synchronization circuit according to the present invention.

FIG. 15 explains a ninth embodiment of the present invention. In this embodiment, the above-described converting circuit 30 including the first level shaper 31, the second level shaper 32, and the adder 33 is inserted between the phase comparator 12 and the loop filter 13 of the phase synchronization circuit shown in FIG. 7.

Figure 16:
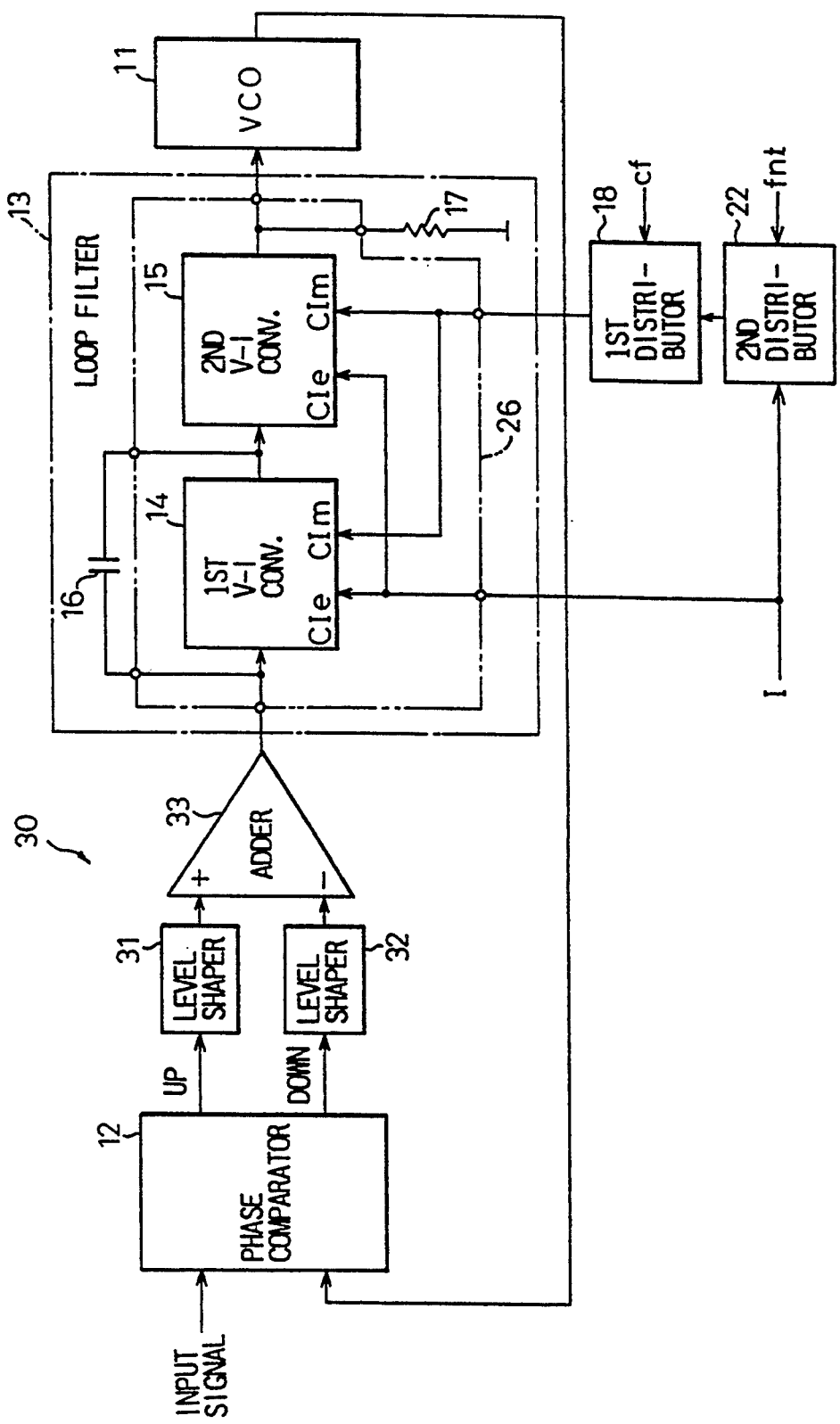
FIG. 16 is a block circuit diagram showing a tenth embodiment of a phase synchronization circuit according to the present invention.

FIG. 16 explains a tenth embodiment of the present invention. In this embodiment, the above-described converting circuit 30 including the first level shaper 31, the second level shaper 32, and the adder 33 is inserted between the phase comparator 12 and the loop filter 13 of the phase synchronization circuit shown in FIG. 8.

The present invention is not limited to the above embodiments. Various modifications to the present invention are possible. For example, the capacitor 16 may be connected between input and output terminals of the second voltage-current converter 15, and the resistor 17 may be connected between output terminal and ground. This modification is shown as an eleventh embodiment of the present invention in FIG. 17. This modification can be applied to every embodiment described above.

Further, in the above embodiments, the frequency of an input signal is changed in two stages. However, the frequency may be changed in multiple stages. In this case, the control currents I and I' for the voltage-current converters 14 and 15 are changed to carry out phase synchronization according to the frequency of the input signal.

What is claimed is:

1. A phase synchronization circuit for generating a clock signal from an input signal, having a voltage-controlled oscillator, a phase comparator for comparing the phase of the input signal with that of an output signal of the voltage-controlled oscillator, and a loop filter for receiving an output signal of the phase comparator and providing a control voltage for the voltage-controlled oscillator, the loop filter comprising:

a first voltage-current converter for receiving the output signal of the phase comparator;

a second voltage-current converter for receiving an output signal of the first voltage-current converter;

a capacitor connected between input and output terminals of the first voltage-current converter; and a resistor connected between an output termial of the second voltage converter and ground, for converting an output signal of the second voltage-current converter into the control voltage for the voltage-controlled oscillator.

2. The phase synchronization circuit as set forth in claim 1, wherein the first and the second voltage-current converters have a control terminal respectively, and when a control signal corresponding to a frequency of the input signal to the phase comparator is input to the control terminal, a transconductance of the first and the second voltage-current converters will be changed and a control voltage to the VCO will be changed.

3. The phase synchronization circuit as set forth in claim 2, wherein the input signal is the read signal from a magnetic disk drive applying a zone-bit-recording method, and the read signal indicates a track number of a magnetic disk of the disk drive.

4. The phase synchronization circuit as set forth in claim 2, wherein each the first and the second voltage-current converters is a current multiplier having an input stage and an output stage, the input stage comprising:

diodes connected to a first reference voltage in parallel;

transistors whose collectors are connected to the diodes respectively, for turning on or off in accordance with the input signal;

a resistor connected between emitters of the transistors; and first constant current sources connected between the emitters of the transistors and the ground, the output stage comprising;
   a second constant current sources connected to a second reference voltage;
   transistors whose collectors are connected to the second current sources and whose bases are connected to the collectors of the transistors of the input stage; and
   a third current source commonly connected to the emitters of the transistors and the ground; and
   wherein the first constant current sources are controlled by the control signal input to a control terminal provided at the first and the second voltage-current converters, and the second constant current sources and the third current source are controlled by the control signal input to a control terminal provided at the first and the second voltage-current converters.

5. The phase synchronization circuit as set forth in claim 4, further comprising a distributor for changing, according to a cut-off frequency, the ratio between control currents supplied by a reference current source to the input and output stages of a current multiplier in each of the first and second voltage-current converters.

6. The phase synchronization circuit as set forth in claim 5, further comprising:
   an adder disposed between the loop filter and the voltage-controlled oscillator, to change the center frequency of the voltage-controlled oscillator according to the cut-off frequency;
   a center frequency table for determining a frequency controlling offset voltage applied to the adder in accordance with the control signal; and
   a cut-off frequency table for determining a signal to apply to the distributor in accordance with the control signal.

7. The phase synchronization circuit as set forth in claim 6, wherein the phase comparator outputs a pulse-width-modulated signal in accordance with the phase difference between the output signal of the VCO and the input signal, further comprising:
   a charge pump circuit connected between the phase comparator and the loop filter, controlled by the output signal of the center frequency table; and
   a capacitor connected between an output terminal of the charge pump circuit and the ground.

8. The phase synchronization circuit as set forth in claim 7, wherein the control signal is head position data from a magnetic disk of a magnetic disk drive.

9. The phase synchronization circuit as set forth in claim 8, wherein the phase comparator outputs a pulse-width-modulated signal in accordance with the phase difference between the output signal of the VCO and the input signal, further comprising:
   a charge pump circuit connected between the phase comparator and the loop filter, controlled by the output signal of the center frequency table; and
   a capacitor connected between an output terminal of the charge pump circuit and the ground.

10. The phase synchronization circuit as set forth in claim 5, further comprising a second distributor connected in series with the first distributor for changing the ratio between the control currents supplied to the input and output stages of each of the current multipliers, to shorten an acquisition time when the frequency of the input signal is changed.

11. The phase synchronization circuit as set forth in claim 5, further comprising a second distributor for changing the control current input to the control terminal, to shorten an acquisition time when the frequency of the input signal is changed.

12. The phase synchronization circuit as set forth in claim 11, wherein the first and second voltage-current converters are formed as an integrated circuit.

13. The phase synchronization circuit as set forth in claim 2, wherein the phase comparator outputs pulse-width-modulated phase lead and phase lag pulses in accordance with a phase difference between the output signal of the VCO and the input signal, further comprising:
   a first level shaper for shaping the phase lead output pulses from the phase comparator by limiting the level thereof to a constant value;
   a second level shaper for shaping the phase lag output pulses from the phase comparator by limiting the level thereof to a constant value; and
   an adder for calculating the difference between a level-shaped phase lead pulse and a level-shaped phase lag pulse, whose output signal is input to the loop filter.

14. The phase synchronization circuit as set forth in claim 13, wherein the input signal is a read signal from a magnetic disk of a magnetic disk drive applying a zone-bit recording method, and the control signal is information of the track number of the magnetic disk.

15. The phase synchronization circuit as set forth in claim 13, wherein the first and the second level shaper and the adder is formed in an integrated circuit as a differential amplifier.

16. The phase synchronization circuit as set forth in claim 5, wherein the phase comparator outputs pulse-width-modulated phase lead and phase lag pulses in accordance with a phase difference between the output signal of the VCO and the input signal, further comprising:
   a first level shaper for shaping the phase lead output pulses from the phase comparator by limiting the level thereof to a constant value;
   a second level shaper for shaping the phase lag output pulses from the phase comparator by limiting the level thereof to a constant value; and
   an adder for calculating the difference between a level-shaped phase lead pulse and a level-shaped phase lag pulse, whose output signal is input to the loop filter.

17. The phase synchronization circuit as set forth in claim 6, wherein the phase comparator outputs pulse-width-modulated phase lead and phase lag pulses in accordance with a phase difference between the output signal of the VCO and the input signal, further comprising:
   a first level shaper for shaping the phase lead output pulses from the phase comparator by limiting the level thereof to a constant value;
   a second level shaper for shaping the phase lag output pulses from the phase comparator by limiting the level thereof to a constant value; and
   an adder for calculating the difference between a level-shaped phase lead pulse and a level-shaped phase lag pulse, whose output signal is input to the loop filter.

18. The phase synchronization circuit as set forth in claim 17, wherein the control signal is head position data from a magnetic disk of a magnetic disk drive.

19. The phase synchronization circuit as set forth in claim 10, wherein the phase comparator outputs pulse-width-modulated phase lead and phase lag pulses in accordance with a phase difference between the output signal of the VCO and the input signal, further comprising:

a first level shaper for shaping the phase lead output pulses from the phase comparator by limiting the level thereof to a constant value;

a second level shaper for shaping the phase lag output pulses from the phase comparator by limiting the level thereof to a constant value; and an adder for calculating the difference between a level-shaped phase lead pulse and a level-shaped phase lag pulse, whose output signal is input to the loop filter.

20. The phase synchronization circuit as set forth in claim 11, wherein the phase comparator outputs pulse-width-modulated phase lead and phase lag pulses in accordance with a phase difference between the output signal of the VCO and the input signal, further comprising:

a first level shaper for shaping the phase lead output pulses from the phase comparator by limiting the level thereof to a constant value;

a second level shaper for shaping the phase lag output pulses from the phase comparator by limiting the level thereof to a constant value; and an adder for calculating the difference between a level-shaped phase lead pulse and a level-shaped phase lag pulse, whose output signal is input to the loop filter.

21. A phase synchronization circuit for generating a clock signal from an input signal, having a voltage-controlled oscillator, a phase comparator for comparing the phase of the input signal with that of an output signal of the voltage-controlled oscillator, and a loop filter for receiving an output signal of the phase comparator and providing a control voltage for the voltage-controlled oscillator, the loop filter comprising:

a first voltage-current converter for receiving the output signal of the phase comparator;

a second voltage-current converter for receiving an output signal of the first voltage-current converter;

a resistor connected between an output termial of the first voltage converter and the ground; and a capacitor connected between input and output terminals of the second voltage-current converter, for converting an output signal of the second voltage-current converter into the control voltage for the voltage-controlled oscillator.

* * * * *